United States Patent
Shin et al.

(10) Patent No.: US 10,854,830 B2
(45) Date of Patent: Dec. 1, 2020

(54) DISPLAY APPARATUS HAVING NON-ADHESIVE MEMBER OR SUPPORT PART SURFACES OVERLAPPING WITH THE FOLDING AREA

(71) Applicant: Samsung Display Co., Ltd., Yongin-si (KR)

(72) Inventors: Jaiku Shin, Hwaseong-si (KR); Mansik Myeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/366,427

(22) Filed: Mar. 27, 2019

(65) Prior Publication Data

US 2019/0305238 A1 Oct. 3, 2019

(30) Foreign Application Priority Data

Mar. 29, 2018 (KR) .................. 10-2018-0036775

(51) Int. Cl.
*H01L 51/00* (2006.01)
*H01L 27/32* (2006.01)

(52) U.S. Cl.
CPC ........ *H01L 51/0097* (2013.01); *H01L 27/323* (2013.01); *H01L 27/3244* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 2016/0338219 A1 | 11/2016 | Seo et al. | |
| 2018/0076221 A1* | 3/2018 | Hanari | ............... H01L 27/1203 |
| 2019/0090364 A1 | 3/2019 | Shin | |

FOREIGN PATENT DOCUMENTS

| | | |
|---|---|---|
| KR | 10-2016-0133053 A | 11/2016 |
| KR | 10-2017-0072973 A | 6/2017 |
| KR | 10-2017-0073304 A | 6/2017 |

* cited by examiner

*Primary Examiner* — Hoai V Pham
(74) *Attorney, Agent, or Firm* — Lewis Roca Rothgerber Christie LLP

(57) ABSTRACT

A display apparatus includes a display module configured to display an image, and defining a folding area that is infoldable about an imaginary folding axis, and a plurality of non-folding areas adjacent respective sides of the folding area in a plane, a support member having a plate shape under the display module, an adhesive member between the display module and the support member, and at least one first non-adhesive member overlapping with the folding area and located between the adhesive member and the support member.

21 Claims, 12 Drawing Sheets

DISPLAY APPARATUS HAVING NON-ADHESIVE MEMBER OR SUPPORT PART SURFACES OVERLAPPING WITH THE FOLDING AREA

CROSS-REFERENCE TO RELATED APPLICATION

This application claims priority to, and the benefit of, Korean Patent Application No. 10-2018-0036775, filed on Mar. 29, 2018, the entire contents of which are hereby incorporated by reference.

BACKGROUND

1. Field

The present disclosure herein relates to a display apparatus with improved durability and display quality.

2. Description of the Related Art

A display apparatus may display various images on a display screen to provide information to a user. Recently, foldable or rollable display apparatuses including flexible display members have been developed. Unlike a flat display apparatus, flexible display apparatuses may be foldable, rollable, or bendable like a piece of paper. The flexible display apparatuses, of which shapes are variously changeable, may be easily portable, and may improve convenience of users.

SUMMARY

The present disclosure may provide a display apparatus with improved durability and display quality.

In an embodiment of the present disclosure, a display apparatus includes a display module configured to display an image, and defining a folding area that is in-foldable about an imaginary folding axis, and a plurality of non-folding areas adjacent respective sides of the folding area in a plane, a support member having a plate shape under the display module, an adhesive member between the display module and the support member, and at least one first non-adhesive member overlapping with the folding area and located between the adhesive member and the support member.

The first non-adhesive member may reduce a coupling strength between the adhesive member and the support member.

The adhesive member may have a single unitary body shape.

A rigidity of the support member may be greater than a rigidity of the display module.

The first non-adhesive member may include fluorine or titanium.

The first non-adhesive member may be coupled to a top surface of the support member facing the adhesive member.

The first non-adhesive member may be provided as a plurality of first non-adhesive members, wherein the support member includes a first support part coupled to the adhesive member and overlapping with a first non-folding area of the non-folding areas that is adjacent to one side of the folding area, and a second support part spaced apart from the first support part, coupled to the adhesive member, and overlapping with a second non-folding area of the non-folding areas that is adjacent to another side of the folding area, and wherein the first non-adhesive members are respectively on top surfaces of the first and second support parts that overlap with the folding area.

Portions of the first and second support parts that overlap with the folding area may be spaced apart from the adhesive member when the display module is folded.

The first non-adhesive member may be coated on the top surface of the support member.

A recess may be defined to be recessed downward from the top surface of the support member while overlapping with the folding area, and the first non-adhesive member may fit in the recess.

The first non-adhesive member may have a thickness of about 5 μm or less.

The display apparatus may further include a second non-adhesive member overlapping with the folding area, and coupled to a bottom surface of the adhesive member, which faces the support member.

The adhesive member may include first portions overlapping with the non-folding areas, and a second portion overlapping with the folding area and located between the first portions to connect the first portions, wherein an adhesive strength of the second portion is less than an adhesive strength of the first portions.

A hardness of the second portion may be less than a hardness of the first portions.

A material of the second portion may be different from a material of the first portions.

The first non-adhesive member may be coupled to a bottom surface of the adhesive member, which faces the support member.

A recess may be defined to be recessed upward from the bottom surface of the adhesive member overlapping with the folding area, wherein the first non-adhesive member fits in the recess.

In an embodiment of the present disclosure, a display apparatus includes a display module configured to display an image, and defining a folding area that is in-foldable about an imaginary folding axis, a first non-folding area at one side of the folding area, and a second non-folding area at another side of the folding area, a support member under the display module, an adhesive member between the display module and the support member, wherein the support member includes a first support part coupled to the adhesive member and overlapping with the first non-folding area, and a second support part spaced apart from the first support part, coupled to the adhesive member, and overlapping with the second non-folding area, and wherein top surfaces of the first and second support parts overlapping with the folding area are not coupled to the adhesive member.

The display apparatus may further include first non-adhesive members between the adhesive member and the support member, overlapping with the folding area, and coupled to the top surfaces of the first and second support parts, respectively, or coupled to a bottom surface of the adhesive member.

The first non-adhesive members may include fluorine or titanium.

The adhesive member may include a single unitary body shape.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the present disclosure and, together with the description, serve to explain principles of the inventive concepts. In the drawings.

DETAILED DESCRIPTION

Figure 1:
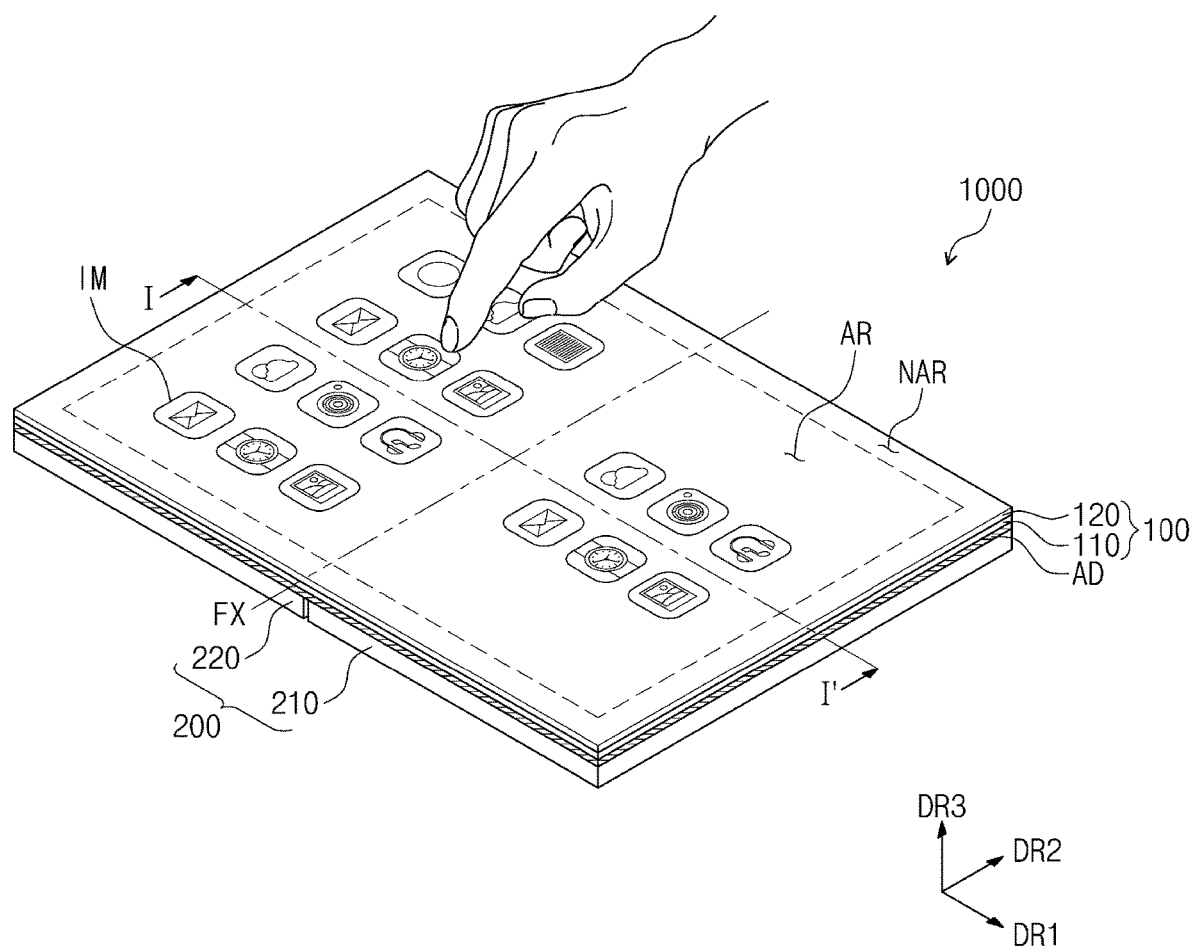
FIG. 1 is a perspective view illustrating a display apparatus according to an embodiment of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled"

refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
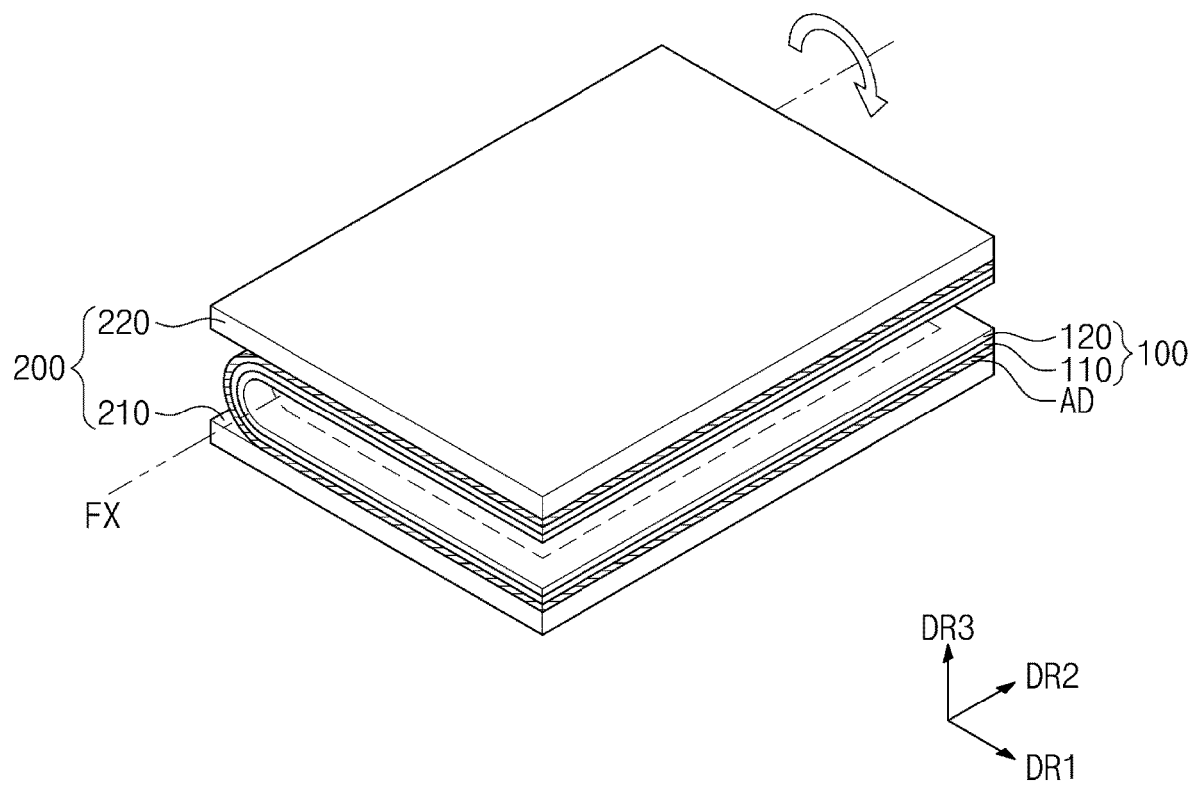
FIG. 2 is a perspective view illustrating the display apparatus of FIG. 1 while in an in-folding mode.
Figure 3:
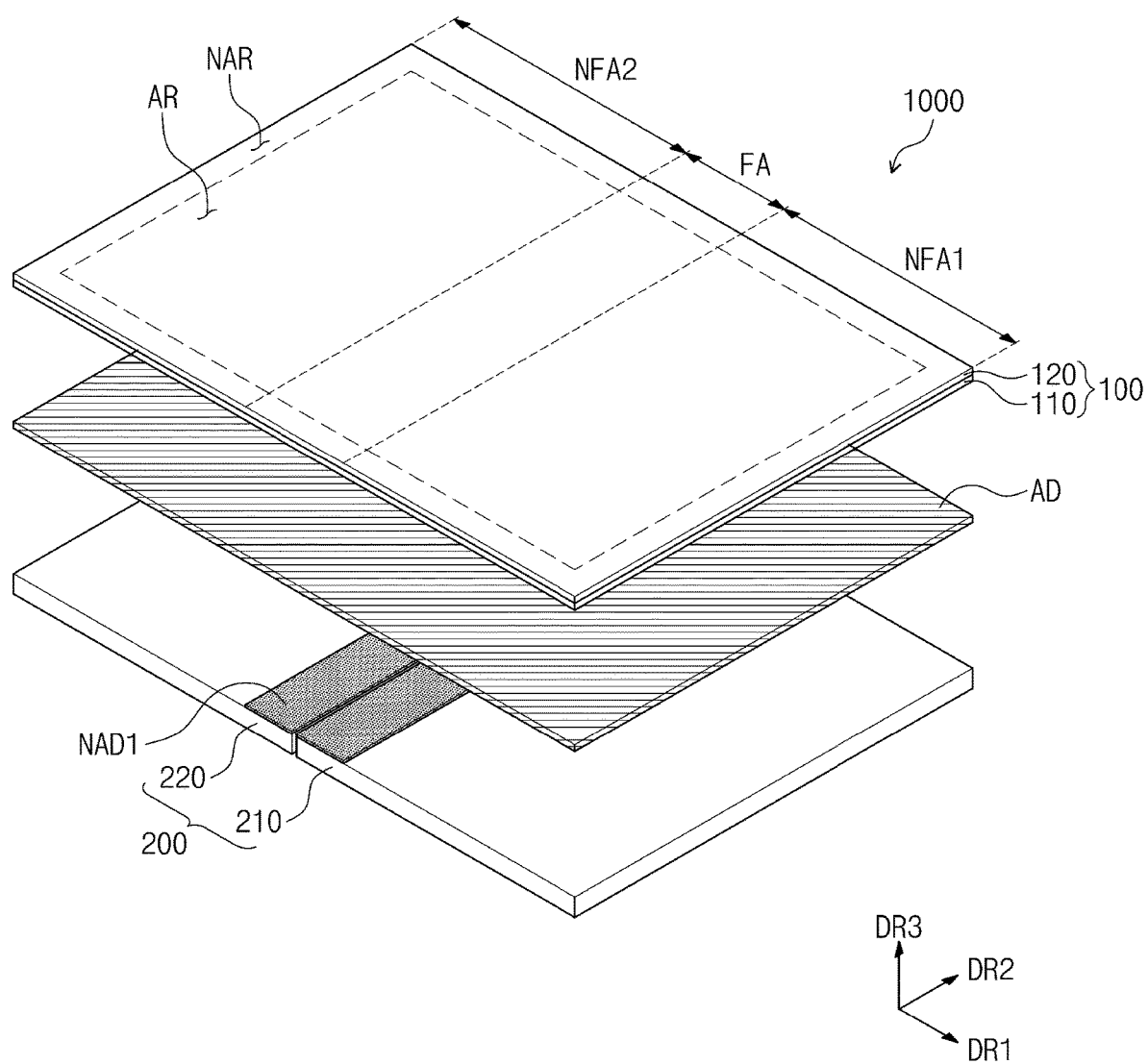
FIG. 3 is an exploded perspective view illustrating the display apparatus of FIG. 1.

FIG. 1 is a perspective view illustrating a display apparatus according to an embodiment of the present disclosure, and FIG. 2 is a perspective view illustrating the display apparatus of FIG. 1 while in an in-folding mode. FIG. 3 is an exploded perspective view illustrating the display apparatus of FIG. 1.

Referring to FIGS. 1 and 2, a display apparatus 1000 according to an embodiment of the present disclosure may have a rectangular shape that has long sides in a first direction DR1, and short sides in a second direction DR2 intersecting the first direction DR1. However, embodiments of the present disclosure are not limited thereto. In other embodiments, the shape of the display apparatus 1000 may be variously modified.

The display apparatus 1000 may be a flexible display apparatus. In detail, the display apparatus 1000 according to the present embodiment may be folded or unfolded about a folding axis FX extending along a given direction. In other words, the display apparatus 1000 may be a foldable display apparatus. In the present embodiment, the folding axis FX may extend in the second direction DR2.

The display apparatus 1000 may include a plurality of areas defined according to the folding of the display apparatus 1000. In more detail, the display apparatus 1000 may include a folding area FA and at least one non-folding area NFA1 and NFA2, which are arranged when viewed in a plan view. Stress may be applied to the folding area FA when the display apparatus 1000 is folded. The folding area FA may overlap with the folding axis FX when viewed in a plan view.

According to the present embodiment, the folding area FA of the display apparatus 1000 may be defined between two non-folding areas NFA1 and NFA2. Hereinafter, the two non-folding areas NFA1 and NFA2 are referred to as a first non-folding area NFA1 and a second non-folding area NFA2, respectively. The first non-folding area NFA1 may be adjacent to one side of the folding area FA along the first direction DR1, and the second non-folding area NFA2 may be adjacent to another side of the folding area FA along the first direction DR1.

The folding area FA, the first non-folding area NFA1 and the second non-folding area NFA2 may also be defined with respect to planes of members included in the display apparatus 1000.

In the present embodiment, the display apparatus 1000 may include one folding area FA. However, embodiments of the present disclosure are not limited thereto. In another embodiment, the display apparatus 1000 may include a plurality of folding areas.

In an embodiment, the display apparatus 1000 may be in-folded (e.g., may have an in-folding mode). In other words, a top surface of the display apparatus 1000 may be defined as a display surface for displaying an image, and the display apparatus 1000 may be folded such that a portion of the top surface of the display apparatus 1000 faces another portion of the top surface of the display apparatus 1000. Thus, in the in-folding mode, the display surface of the display apparatus 1000 may be covered (e.g., on both sides) by a bottom surface of the display apparatus 1000 opposite to the display surface, and thus may be protected from external environment.

The display apparatus 1000 may include a display module 100, a support member 200, an adhesive member AD, and at least one first non-adhesive member NAD1.

The display module 100 may include an active area AR and a peripheral area NAR when viewed in a plan view defined by the first and second directions DR1 and DR2. The active area AR may be defined in a central portion of the display module 100 when viewed in a plan view. The peripheral area NAR may be adjacent to the active area AR.

The peripheral area NAR may surround the active area AR when viewed in a plan view. In the present embodiment, the peripheral area NAR has a frame shape surrounding the active area AR.

However, embodiments of the present disclosure are not limited to the shapes and the numbers of the active area AR and the peripheral area NAR described above. In other embodiments, the display module 100 may include the active area AR without the peripheral area NAR, or may include a plurality of active areas spaced apart from each other.

The display module 100 may include a display member 110 and an input sensing member 120.

The display member 110 may function as a base layer on which the input sensing member 120 is located. The display member 110 may include one insulating substrate or one insulating film. The display member 110 may be configured to display an image IM (see FIG. 1) in the active area AR.

The support member 200 may be located under the display module 100 to support the display module 100. The support member 200 may have a plate shape. A rigidity of the support member 200 may be greater than a rigidity of the display module 100. For example, the support member 200 may include a metal material. However, embodiments of the present disclosure are not limited to the material of the support member 200.

The support member 200 may include a first support part 210 and a second support part 220. The first support part 210 may be located at one side of a center of the support member 200 in the first direction DR1 (e.g., when the display apparatus 1000 is unfolded). The first support part 210 may overlap with the first non-folding area NFA1 and a portion of the folding area FA. The second support part 220 may be located at another side of the center of the support member 200 in the first direction DR1 (e.g., when the display apparatus 1000 is unfolded). The second support part 220 may overlap with the second non-folding area NFA2 and another portion of the folding area FA. The first support part 210 and the second support part 220 may be spaced apart from each other.

The adhesive member AD may be located between the display module 100 and the support member 200. The adhesive member AD may couple, or adhere, the display module 100 to the support member 200 in the non-folding areas NFA1 and NFA2. The adhesive member AD may have a single unitary body shape. In an embodiment, the adhesive member AD may include a thermosetting resin or a photocurable resin.

The first non-adhesive member NAD1 may be located between the adhesive member AD and the support member 200. The first non-adhesive member NAD1 may reduce a coupling strength between the adhesive member AD and the support member 200. For example, the first non-adhesive member NAD1 may include fluorine or titanium. The first non-adhesive member NAD1 may be located to overlap with the folding area FA. The first non-adhesive member NAD1 will be described later in more detail with reference to FIGS. 6 and 7.

Figure 4:
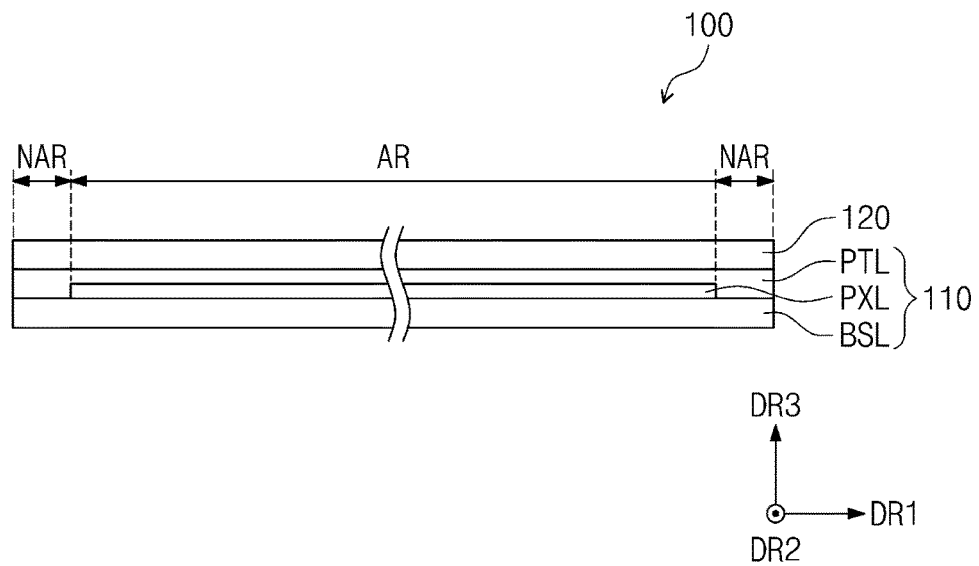
FIG. 4 is an enlarged cross-sectional view illustrating a display module of FIGS. 1 to 3.

FIG. 4 is an enlarged cross-sectional view illustrating a display module of FIGS. 1 to 3.

Referring to FIG. 4, the display member 110 may include a base layer BSL, a pixel layer PXL, and a protective layer PTL. The base layer BSL may define a rear surface of the display module 100. The base layer BSL may be formed of a flexible material.

The pixel layer PXL may be located on the base layer BSL. The pixel layer PXL may include a plurality of pixels. The pixels may receive electrical signals to display the image IM.

According to an embodiment of the present disclosure, a type of the display member 110 may be determined depending on components of the pixel layer PXL. For example, the display member 110 may be a liquid crystal display panel, an organic light emitting display panel, an electrophoretic display panel, an electrowetting display panel, or one of other various display panels capable of displaying images. The display member 110 according to the inventive concepts may be one of display members according to still other various embodiments, and the inventive concepts are not limited to one of the embodiments.

Figure 5:
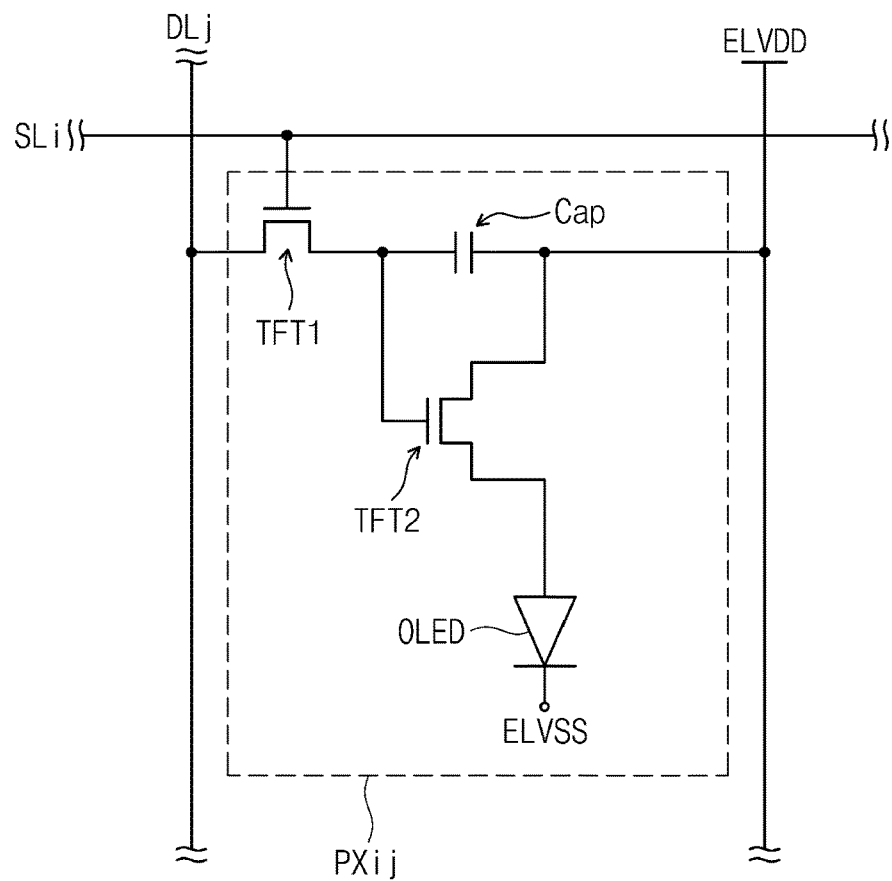
FIG. 5 is an equivalent circuit diagram of a pixel of a display apparatus according to an embodiment of the present disclosure.

FIG. 5 is an equivalent circuit diagram of a pixel of a display apparatus according to an embodiment of the present disclosure.

Referring to FIG. 5, the display member 110 may be the organic light emitting display panel. Thus, a pixel PXij may include at least one thin film transistor, at least one capacitor, and at least one display element. In the present embodiment, the pixel PXij may include a first thin film transistor TFT1, a second thin film transistor TFT2, a capacitor Cap, and an organic light emitting element OLED.

The first thin film transistor TFT1 may include a control electrode connected to an $i^{th}$ scan line SLi, an input electrode connected to a $j^{th}$ data line DLj, and an output electrode. The first thin film transistor TFT1 may output a data signal provided through the $j^{th}$ data line DLj in response to a scan signal applied to the $i^{th}$ scan line SLi.

The capacitor Cap may include a first capacitor electrode connected to the first thin film transistor TFT1, and a second capacitor electrode for receiving a first power source voltage ELVDD. The capacitor Cap may be charged with charges corresponding to a difference between the first power source voltage ELVDD and a voltage corresponding to the data signal received from the first thin film transistor TFT1.

The second thin film transistor TFT2 may include a control electrode connected to the output electrode of the first thin film transistor TFT1 and the first capacitor electrode of the capacitor Cap, an input electrode for receiving the first power source voltage ELVDD, and an output electrode. The output electrode of the second thin film transistor TFT2 may be connected to the organic light emitting element OLED.

The second thin film transistor TFT2 may control a driving current, which flows through the organic light emitting element OLED, in response to the amount of the charges stored in the capacitor Cap. A turn-on time of the second thin film transistor TFT2 may be determined depending on the amount of the charges stored in the capacitor Cap. Substantially, the output electrode of the second thin film transistor TFT2 may supply a voltage, a level of which is lower than that of the first power source voltage ELVDD, to the organic light emitting element OLED.

The organic light emitting element OLED may include a first electrode connected to the second thin film transistor TFT2, and a second electrode for receiving a second power source voltage ELVSS. The organic light emitting element OLED may include an emission pattern located between the first electrode and the second electrode.

The organic light emitting element OLED may emit light during a turn-on period of the second thin film transistor TFT2. A color of the light generated from the organic light emitting element OLED may be determined by a material of the emission pattern. For example, the color of the light generated from the organic light emitting element OLED may be a red color, a green color, a blue color, or a white color.

Referring again to FIG. 4, the protective layer PTL may be located on the pixel layer PXL to cover the pixel layer PXL. The protective layer PTL may electrically insulate the pixel layer PXL from the input sensing member 120.

For example, the protective layer PTL may be an encapsulation layer for encapsulating the pixel layer PXL. In this case, the protective layer PTL may include at least one organic layer and/or at least one inorganic layer.

Alternatively, the protective layer PTL may be a planarization layer that covers the pixel layer PXL and has a planarized top surface. The protective layer PTL may have at least one of various characteristics and/or functions, and the inventive concepts are not limited to one of the various embodiments.

The input sensing member 120 may be located on the protective layer PTL. The active area AR of the input sensing member 120 may substantially overlap with an area in which the pixel layer PXL is located.

The input sensing member 120 may sense an external input provided to the active area AR of the display module 100.

The external input may include at least one of various types of inputs. FIG. 1 illustrates an embodiment in which the display module 100 senses the external input provided by a portion (e.g., a finger) of a body of a user. However, embodiments of the present disclosure are not limited to this type of the external input provided to the input sensing member 120. In other embodiments, the external input may be provided in an optical type, a touch type, or a magnetic type.

Even though not shown in the drawings, the input sensing member 120 may include an input sensing cell, driving lines, and pads. The input sensing cell may include a plurality of input sensing sensors used to sense the external input. The driving lines and the pads may be used to apply electrical signals to the input sensing cell and/or to transmit electrical signals generated from the input sensing cell to the outside. The pads may be connected to the display member 110 and/or an external power supply unit.

The input sensing member 120 may sense the external input by at least one of various methods. For example, the input sensing member 120 may be driven by a capacitive method, a resistive method, or a coordinate recognition method.

Figure 6:
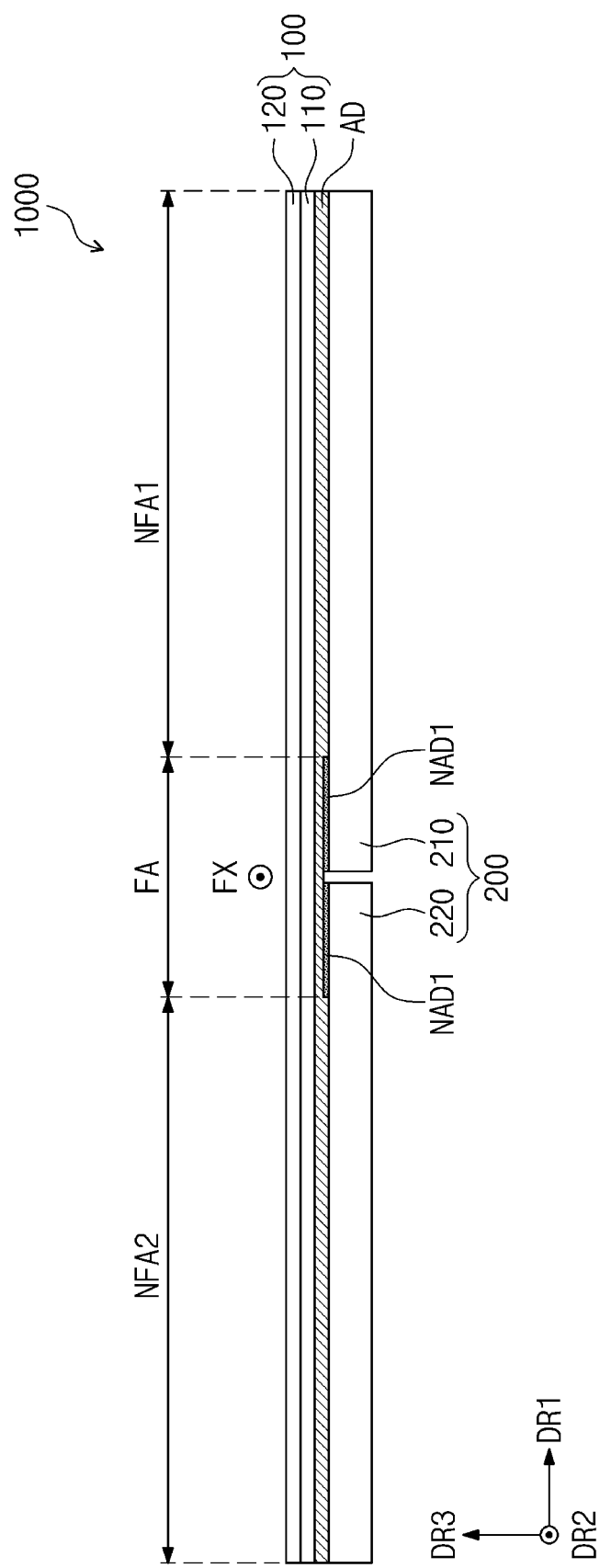
FIG. 6 is a cross-sectional view taken along the line I-I' of FIG. 1.
Figure 7:
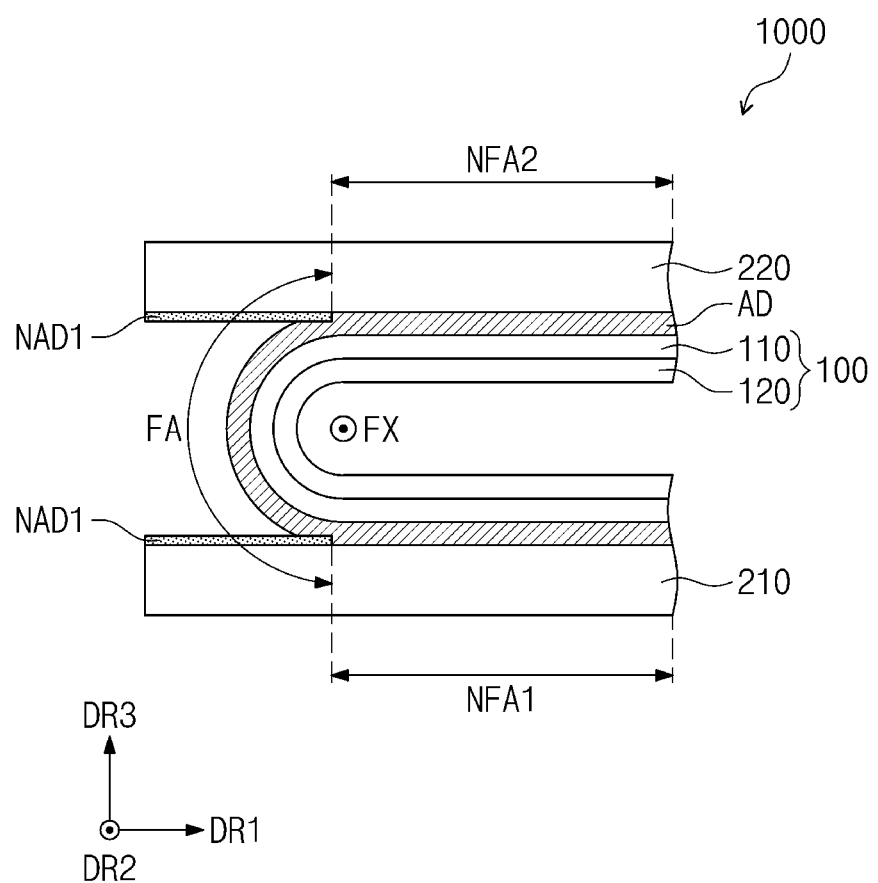
FIG. 7 is a cross-sectional view illustrating an in-folded display apparatus.

FIG. 6 is a cross-sectional view taken along the line I-I' of FIG. 1, and FIG. 7 is a cross-sectional view illustrating an in-folded display apparatus.

Referring to FIGS. 6 and 7, the first non-adhesive member NAD1 may be located between the adhesive member AD and the support member 200, as described above.

According to the present embodiment, the first non-adhesive member NAD1 may be provided in plurality. The first non-adhesive members NAD1 may be located on a top surface of the first support part 210 and a top surface of the second support part 220, respectively. Here, the top surfaces of the first and second support parts 210 and 220 may face the adhesive member AD.

The first non-adhesive members NAD1 may be coupled to the top surfaces of the first and second support parts 210 and 220, respectively. In the present embodiment, the first non-adhesive member NAD1 may have a shape coated on the top surface of the support member 200. However, embodiments of the present disclosure are not limited to the shape of the first non-adhesive member NAD1. In another embodiment, the first non-adhesive members NAD1 may be coupled in a film or sheet shape to the top surfaces of the first and second support parts 210 and 220, respectively.

The first non-adhesive member NAD1 may overlap with the folding area FA. In more detail, the first non-adhesive member NAD1 may be located on the top surface of each of the first and second support parts 210 and 220, which overlaps with the folding area FA.

The first non-adhesive member NAD1 may include fluorine or titanium. For example, the first non-adhesive member NAD1 may include an anti-fingerprint coating agent. A thickness of the first non-adhesive member NAD1 may be about 1 µm or less.

The first non-adhesive members NAD1 may reduce or eliminate a coupling strength between the adhesive member AD and the support member 200. Thus, the adhesive member AD may not be coupled to the support member 200 in the folding area FA in which the first non-adhesive members NAD1 are located. The adhesive member AD may be coupled or adhered to the top surface of the first support part 210 overlapping with the first non-folding area NFA1, and to the top surface of the second support part 220 overlapping with the second non-folding area NFA2.

According to the present embodiment, when the display module 100 is folded, portions of the first and second support parts 210 and 220 overlapping with the folding area FA may be spaced apart from the adhesive member AD by the first non-adhesive members NAD1. Thus, even though the display module 100 is folded, the first and second support parts 210 and 220 having relatively large rigidity may remain unfolded. As a result, stress applied to the folding area FA of the display module 100 may be reduced.

Conventionally, fatigue may accumulate in the display module 100 overlapping with the folding area FA by repeated folding and unfolding operations of the display apparatus 1000. Thus, a shape of the display module 100 corresponding to the folding area FA may be deformed.

For example, and unlike the present embodiment, if the adhesive member AD is not located in the folding area FA, and is located in only the non-folding areas NFA1 and NFA2, an empty space may be formed between the support member 200 and the display module 100 of the folding area FA. In this case, the folding area FA of the display module 100 in which the fatigue is accumulated may not be supported by the support member 200, and the adhesive member AD but may be depressed into the empty space by gravity (e.g., may sag). Thus, display quality of the display apparatus 1000 may be deteriorated and/or a defect may occur in the display apparatus 1000.

However, according to the present embodiment, because the adhesive member AD has the single unitary body shape overlapping with the folding area FA and the non-folding areas NFA1 and NFA2, the folding area FA of the display module 100 may be supported by the adhesive member AD when the display apparatus 1000 is in the unfolded state to display an image. Thus, according to the present embodiment, the deformation phenomenon of the shape of the display module 100 may be reduced or minimized, and deterioration of the display quality of the display apparatus 1000 may be minimized or prevented.

Unlike the present embodiment, if the adhesive member AD does not have the single unitary body shape, but instead includes a plurality of adhesive members AD located in the non-folding areas NFA1 and NFA2, respectively, the adhesive members AD may be connected to each other through an additional member. In this case, height differences may occur at boundaries between the additional member and the adhesive members AD, and the boundaries may be visible to the outside due to the height differences. However, according to the present embodiment, the adhesive member AD may have the single unitary body shape, and thus a boundary visible to the outside may not occur.

Figure 8:
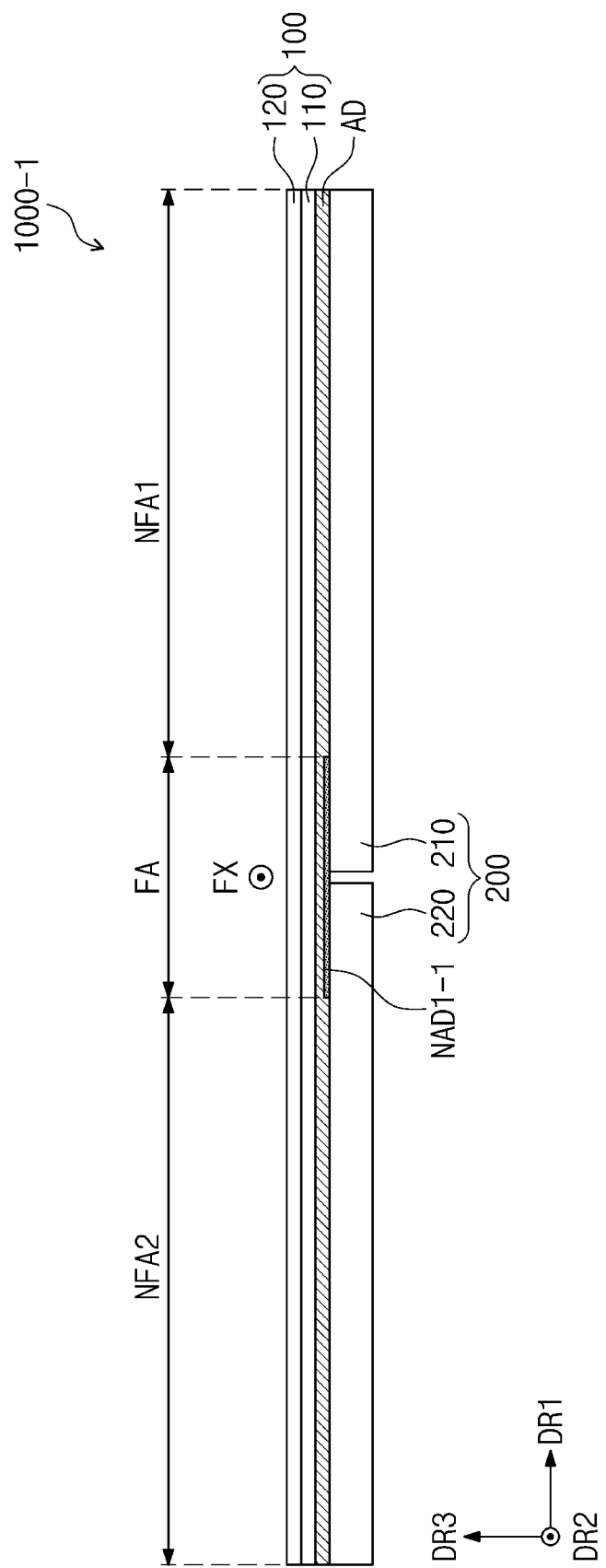
FIG. 8 is a cross-sectional view illustrating a display apparatus according to an embodiment of the present disclosure.
Figure 9:
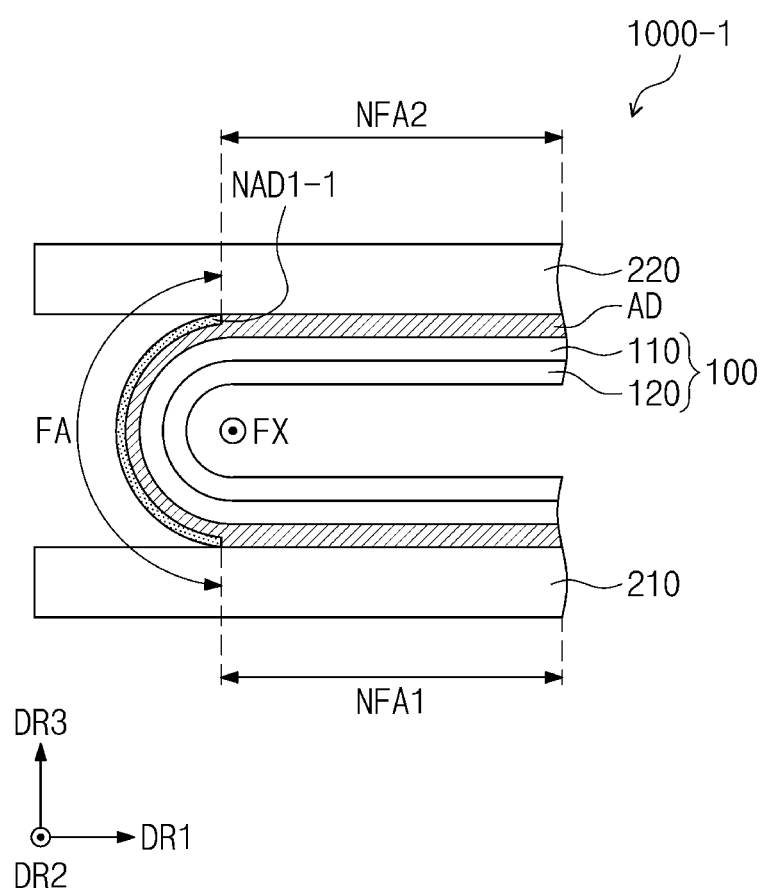
FIG. 9 is a cross-sectional view illustrating the display apparatus of FIG. 8 while in an in-folding mode.

FIG. 8 is a cross-sectional view illustrating a display apparatus according to an embodiment of the present disclosure, and FIG. 9 is a cross-sectional view illustrating the display apparatus of FIG. 8 while in an in-folding mode.

For the purpose of ease and convenience in description, differences between the present embodiment and the embodiment described above will be mainly described, and the same descriptions as in the above embodiment will be omitted. In addition, the same components as described above will be indicated by the same reference numerals or the same reference designators, and repeated descriptions thereto will be omitted.

Referring to FIGS. 8 and 9, a display apparatus 1000-1 according to an embodiment of the present disclosure may include a first non-adhesive member NAD1-1 coupled to a bottom surface of the adhesive member AD. Here, the bottom surface of the adhesive member AD may be a surface facing the support member 200. The first non-adhesive member NAD1-1 may not be coupled to the top surface of the support member 200.

In the present embodiment, the first non-adhesive member NAD1-1 may have a shape coated on the bottom surface of the adhesive member AD. However, embodiments of the present disclosure are not limited to the shape of the first non-adhesive member NAD1-1.

According to the present embodiment, when the display module 100 is folded, a portion of the adhesive member AD overlapping with the folding area FA may be spaced apart from the first and second support parts 210 and 220 by the first non-adhesive member NAD1-1. Thus, even though the display module 100 is folded, the first and second support parts 210 and 220 having the relatively high rigidity may not be folded. As a result, stress applied to the folding area FA of the display module 100 may be reduced.

In addition, according to the present embodiment, because the adhesive member AD has the single unitary body shape overlapping with the folding area FA and the non-folding areas NFA1 and NFA2, the folding area FA of the display module 100 may be supported by the adhesive member AD. Thus, display quality and durability of the display apparatus 1000-1 may be improved.

Figure 10:
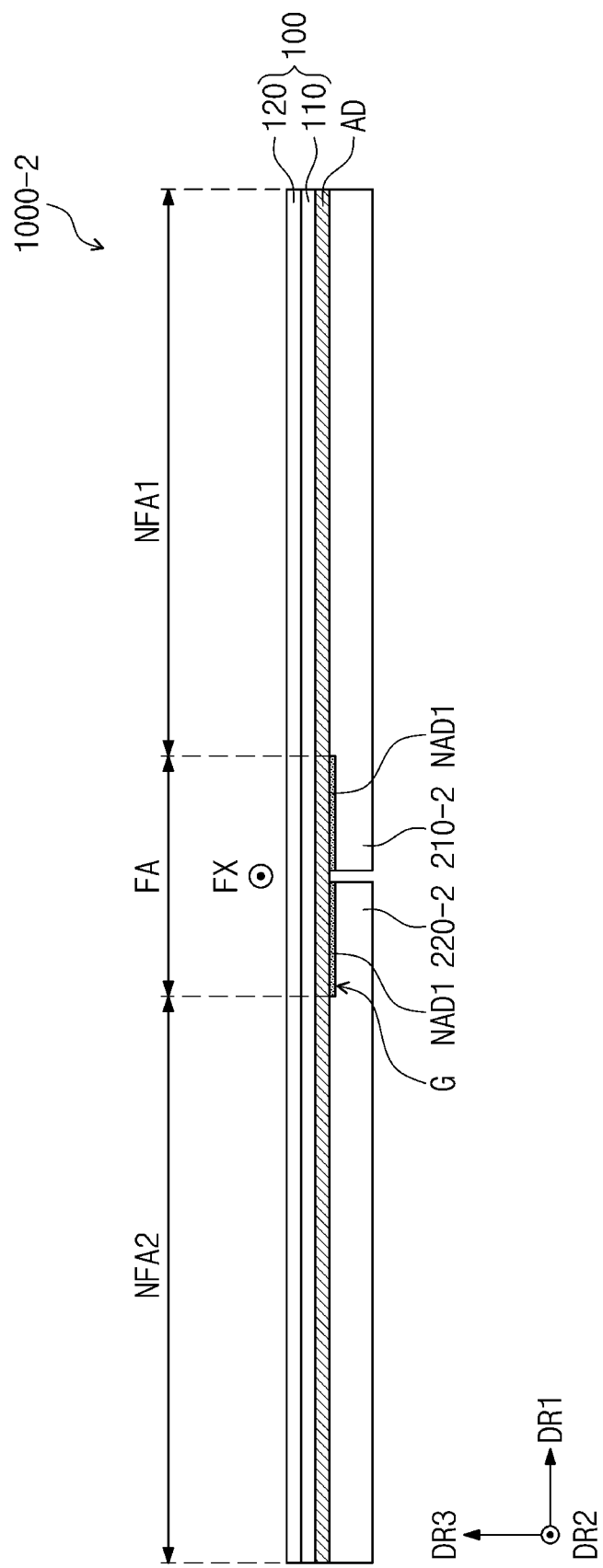
FIG. 10 is a cross-sectional view illustrating a display apparatus according to an embodiment of the present disclosure.

FIG. 10 is a cross-sectional view illustrating a display apparatus according to an embodiment of the present disclosure.

For the purpose of ease and convenience in description, differences between the present embodiment and the above embodiments will be mainly described, and repetition of the same descriptions as in the above embodiments will be omitted. In addition, the same components as described above will be indicated by the same reference numerals or the same reference designators, and the descriptions thereto will not be repeated.

Referring to FIG. 10, in a display apparatus 1000-2 according to the present embodiment, a recess G may be defined at a top surface of each of first and second support parts 210-2 and 220-2. The recess G may have a shape recessed downward from the top surface of each of the first and second support parts 210-2 and 220-2. The recesses G may overlap with the folding area FA.

According to the present embodiment, the first non-adhesive member NAD1 may be located in the recess G. In FIG. 10, a top surface of the first non-adhesive member NAD1 is substantially coplanar with the top surface of each of the first and second support parts 210-2 and 220-2 respectively overlapping with the non-folding areas NFA1 and NFA2. However, embodiments of the present disclosure are not limited thereto. In another embodiment, the top surface of the first non-adhesive member NAD1 may be located at a different level from the top surface of each of the first and second support parts 210-2 and 220-2 overlapping with the non-folding areas NFA1 and NFA2.

Figure 11:
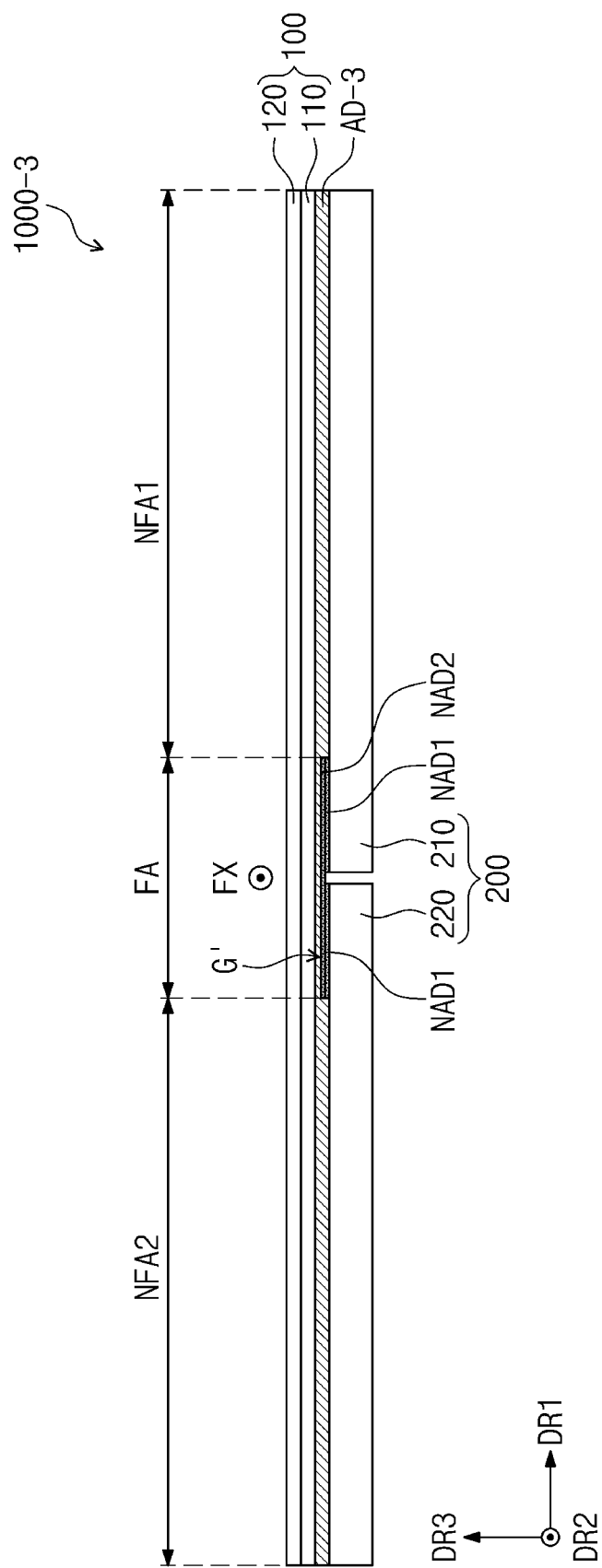
FIG. 11 is a cross-sectional view illustrating a display apparatus according to an embodiment of the present disclosure.

FIG. 11 is a cross-sectional view illustrating a display apparatus according to an embodiment of the present disclosure.

For the purpose of ease and convenience in description, differences between the present embodiment and the above embodiments will be mainly described, and the same descriptions as in the above embodiments will be omitted. In addition, the same components as described above will be indicated by the same reference numerals or the same reference designators, and repeated descriptions thereto will be omitted.

Referring to FIG. 11, a display apparatus 1000-3 according to the present embodiment may further include a second non-adhesive member NAD2.

The second non-adhesive member NAD2 may be coupled to a bottom surface of an adhesive member AD-3. Here, the bottom surface of the adhesive member AD-3 may be a surface facing the support member 200. The second non-adhesive member NAD2 is not coupled to the top surface of the support member 200.

The second non-adhesive member NAD2 may overlap with the folding area FA. A bottom surface of the second non-adhesive member NAD2 may be in direct contact with the top surface of the first non-adhesive member NAD1 located on the support member 200.

The second non-adhesive member NAD2 may reduce an adhesive strength of the adhesive member AD-3 in the folding area FA. Thus, even though the second non-adhesive member NAD2 is in contact with the first non-adhesive member NAD1, the first and second non-adhesive members NAD1 and NAD2 are not coupled to each other.

In the present embodiment, a recess G' may be defined at the bottom surface of the adhesive member AD-3. The recess G' may have a shape recessed upward from the bottom surface of the adhesive member AD-3. The recess G' may overlap with the folding area FA.

The second non-adhesive member NAD2 may be located in the recess G'. Thus, in an embodiment, the bottom surface of the second non-adhesive member NAD2 may be substantially coplanar with the bottom surface of the adhesive member AD-3 overlapping with the non-folding areas NFA1 and NFA2. However, embodiments of the present disclosure are not limited thereto. In another embodiment, the bottom surface of the second non-adhesive member NAD2 may be located at a different level from the bottom surface of the adhesive member AD-3 overlapping with the non-folding areas NFA1 and NFA2 (e.g., such that the bottom surface(s) of the first non-adhesive member(s) NAD1 may be at a same level as the bottom surface of the adhesive member AD-3).

In still another embodiment, the recess may not be formed in the adhesive member AD-3, and the second non-adhesive member NAD2 may be located on a flat bottom surface of the adhesive member AD-3.

Figure 12:
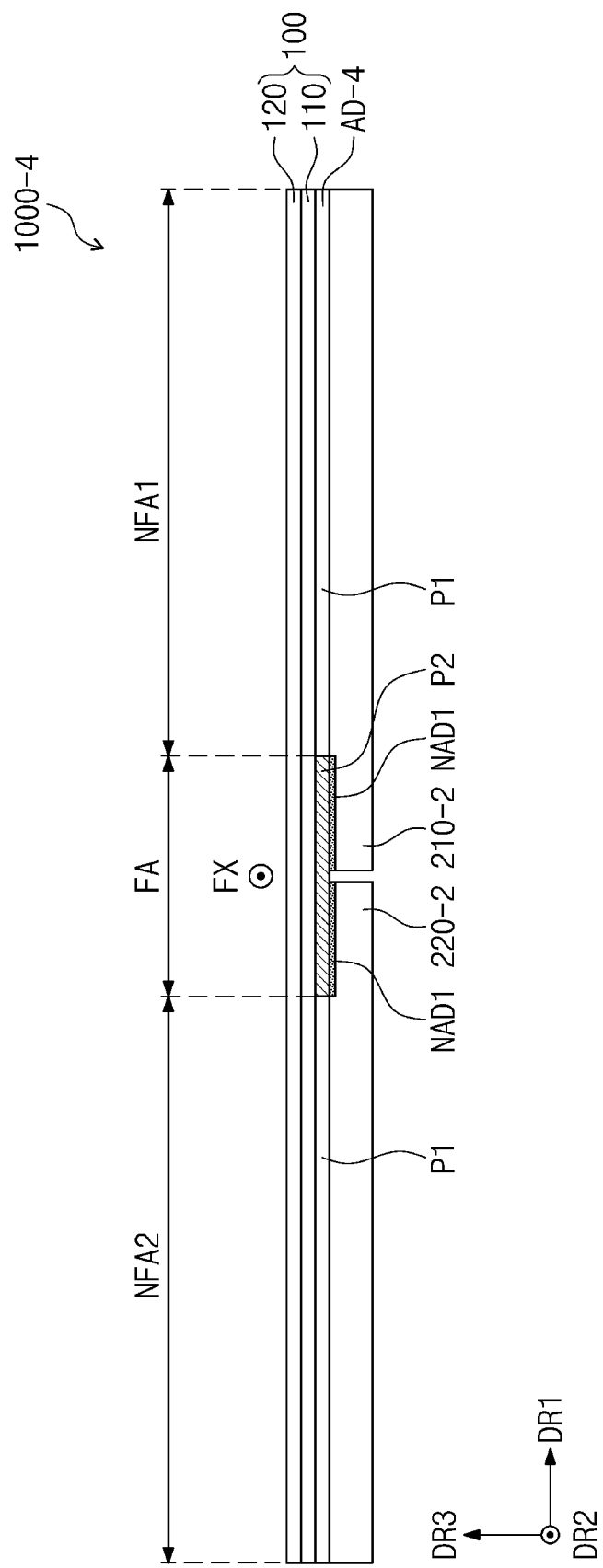
FIG. 12 is a cross-sectional view illustrating a display apparatus according to an embodiment of the present disclosure.

FIG. 12 is a cross-sectional view illustrating a display apparatus according to an embodiment of the present disclosure.

For the purpose of ease and convenience in description, differences between the present embodiment and the above embodiments will be mainly described and the same descriptions as in the above embodiments will be omitted. In addition, the same components as described above will be indicated by the same reference numerals or the same reference designators, and the descriptions thereto will be omitted herebelow.

Referring to FIG. 12, an adhesive member AD-4 of a display apparatus 1000-4 according to the present embodiment may have different adhesive strengths in different areas.

In more detail, the adhesive member AD-4 may include a plurality of first portions P1 and a second portion P2. The second portion P2 may be located between the first portions P1, and may be connected to the first portions P1. The first portions P1 and the second portion P2 may be connected to each other to constitute a single unitary body.

The first portions P1 may overlap with the first non-folding area NFA1 and the second non-folding area NFA2, respectively. The second portion P2 may overlap with the folding area FA.

According to the present embodiment, an adhesive strength of the second portion P2 may be less than an adhesive strength of each of the first portions P1. A hardness of the second portion P2 may be less than a hardness of each of the first portions P1. In addition, a material of the second portion P2 may be different from a material of each of the first portions P1.

Figure 13:
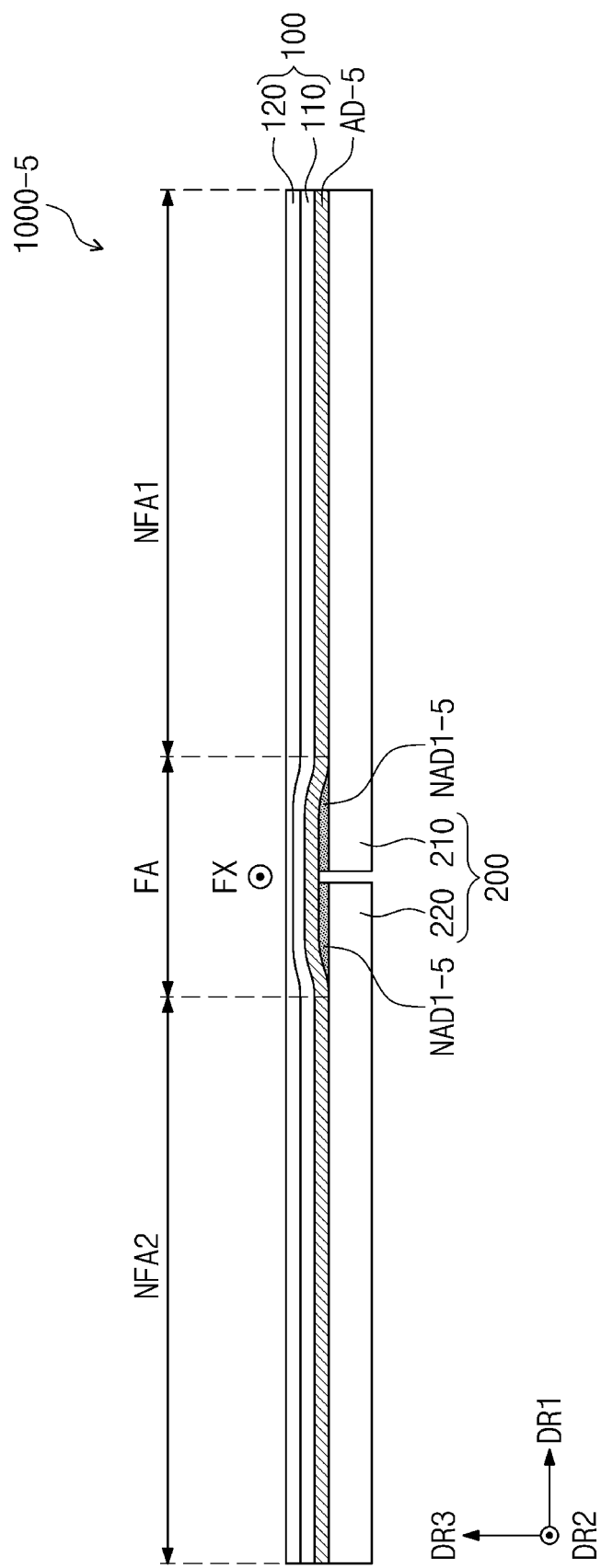
FIG. 13 is a cross-sectional view illustrating a display apparatus according to an embodiment of the present disclosure.

FIG. 13 is a cross-sectional view illustrating a display apparatus according to an embodiment of the present disclosure.

For the purpose of ease and convenience in description, differences between the present embodiment and the above embodiments will be mainly described and the same descriptions as in the above embodiments will be omitted. In addition, the same components as described above will be indicated by the same reference numerals or the same reference designators, and the descriptions thereto will be omitted.

Referring to FIG. 13, a thickness of a first non-adhesive member NAD1-5 of a display apparatus 1000-5 according to the present embodiment may be equal to or greater than about 1 µm, and equal to or less than about 5 µm. In other words, the thickness of the first non-adhesive member NAD1-5 according to the present embodiment may be greater than the thickness of the first non-adhesive member NAD1 described above with reference to FIG. 6. In this case, the folding area FA of the display module 100, the shape of which may be deformed by the fatigue accumulated by repeated folding and unfolding operations, may be effectively supported by step differences, or gradual differences, formed by the first non-adhesive members NAD1-5 having the thick thicknesses.

According to the embodiments of the present disclosure, the durability and display quality of the display apparatus may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their functional equivalents, and shall not be restricted or limited by the foregoing description.

What is claimed is:

1. A display apparatus comprising:
    a display module configured to display an image, and defining a folding area that is in-foldable about an imaginary folding axis, and a plurality of non-folding areas adjacent respective sides of the folding area in a plane;
    a support member having a plate shape under the display module;
    an adhesive member between the display module and the support member; and
    at least one first non-adhesive member overlapping with the folding area and located between the adhesive member and the support member.

2. The display apparatus of claim 1, wherein the first non-adhesive member reduces a coupling strength between the adhesive member and the support member.

3. The display apparatus of claim 1, wherein the adhesive member has a single unitary body shape.

4. The display apparatus of claim 1, wherein a rigidity of the support member is greater than a rigidity of the display module.

5. The display apparatus of claim 1, wherein the first non-adhesive member comprises fluorine or titanium.

6. The display apparatus of claim 1, wherein the first non-adhesive member is coupled to a top surface of the support member facing the adhesive member.

7. The display apparatus of claim 6, wherein the first non-adhesive member is provided as a plurality of first non-adhesive members,
    wherein the support member comprises:
        a first support part coupled to the adhesive member and overlapping with a first non-folding area of the non-folding areas that is adjacent to one side of the folding area; and
        a second support part spaced apart from the first support part, coupled to the adhesive member, and overlapping with a second non-folding area of the non-folding areas that is adjacent to another side of the folding area, and
    wherein the first non-adhesive members are respectively on top surfaces of the first and second support parts that overlap with the folding area.

8. The display apparatus of claim 7, wherein portions of the first and second support parts that overlap with the folding area are spaced apart from the adhesive member when the display module is folded.

9. The display apparatus of claim 6, wherein the first non-adhesive member is coated on the top surface of the support member.

10. The display apparatus of claim 6, wherein a recess is defined to be recessed downward from the top surface of the support member while overlapping with the folding area, and
    wherein the first non-adhesive member fits in the recess.

11. The display apparatus of claim 6, wherein the first non-adhesive member has a thickness of about 5 μm or less.

12. The display apparatus of claim 6, further comprising a second non-adhesive member overlapping with the folding area, and coupled to a bottom surface of the adhesive member, which faces the support member.

13. The display apparatus of claim 6, wherein the adhesive member comprises:
    first portions overlapping with the non-folding areas; and
    a second portion overlapping with the folding area and located between the first portions to connect the first portions, and
    wherein an adhesive strength of the second portion is less than an adhesive strength of the first portions.

14. The display apparatus of claim 13, wherein a hardness of the second portion is less than a hardness of the first portions.

15. The display apparatus of claim 13, wherein a material of the second portion is different from a material of the first portions.

16. The display apparatus of claim 1, wherein the first non-adhesive member is coupled to a bottom surface of the adhesive member, which faces the support member.

17. The display apparatus of claim 16, wherein a recess is defined to be recessed upward from the bottom surface of the adhesive member overlapping with the folding area, and
    wherein the first non-adhesive member fits in the recess.

18. A display apparatus comprising:
    a display module configured to display an image, and defining a folding area that is in-foldable about an imaginary folding axis, a first non-folding area at one side of the folding area, and a second non-folding area at another side of the folding area;
    a support member under the display module;
    an adhesive member between the display module and the support member,
    wherein the support member comprises:
        a first support part coupled to the adhesive member and overlapping with the first non-folding area; and
        a second support part spaced apart from the first support part, coupled to the adhesive member, and overlapping with the second non-folding area, and
    wherein top surfaces of the first and second support parts overlapping with the folding area are not coupled to the adhesive member.

19. The display apparatus of claim 18, further comprising first non-adhesive members between the adhesive member and the support member, overlapping with the folding area, and coupled to the top surfaces of the first and second support parts, respectively, or coupled to a bottom surface of the adhesive member.

20. The display apparatus of claim 19, wherein the first non-adhesive members comprise fluorine or titanium.

21. The display apparatus of claim 18, wherein the adhesive member comprises a single unitary body shape.

* * * * *